(12) United States Patent
Yoshihara et al.

(10) Patent No.: US 8,642,939 B2
(45) Date of Patent: Feb. 4, 2014

(54) SEMICONDUCTOR IMAGE SENSOR MODULE, METHOD FOR MANUFACTURING THE SAME AS WELL AS CAMERA AND METHOD FOR MANUFACTURING THE SAME

(75) Inventors: Ikuo Yoshihara, Kanagawa (JP); Masamitsu Yamanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/442,414

(22) Filed: Apr. 9, 2012

(65) Prior Publication Data
US 2012/0261554 A1    Oct. 18, 2012

Related U.S. Application Data

(60) Continuation of application No. 12/627,970, filed on Nov. 30, 2009, now Pat. No. 8,168,932, which is a continuation of application No. 11/810,438, filed on Jun. 5, 2007, now Pat. No. 7,626,155, which is a division of application No. 11/253,255, filed on Oct. 18, 2005, now Pat. No. 7,319,217.

(30) Foreign Application Priority Data

Oct. 26, 2004   (JP) .................................. 2004-311062

(51) Int. Cl.
*H01L 23/48*    (2006.01)

(52) U.S. Cl.
USPC ......... 250/208.1; 257/737; 257/738; 257/444

(58) Field of Classification Search
USPC ............... 250/208.1; 257/432, 444, 446, 448, 257/473, 737, 774
See application file for complete search history.

(56) References Cited

U.S. PATENT DOCUMENTS

| | | |
|---|---|---|
| 4,543,486 A | 9/1985 | Rose |
| 5,043,582 A | 8/1991 | Cox et al. |
| 6,992,297 B2 * | 1/2006 | Kuroda et al. ........... 250/370.13 |

* cited by examiner

*Primary Examiner* — Tony Ko
(74) *Attorney, Agent, or Firm* — Rader, Fishman & Grauer PLLC

(57) ABSTRACT

A semiconductor image sensor module 1 at least includes a semiconductor image sensor chip 2 having a transistor forming region on a first main surface of a semiconductor substrate and having a photoelectric conversion region with a light incident surface formed on a second main surface on the side opposite to the first main surface and an image signal processing chip 3 for processing image signals formed in the semiconductor image sensor chip 2, wherein a plurality of bump electrodes 15a are formed on a first main surface, a plurality of bump electrodes 15b are formed on the image signal processing chip 3, both the chips 2 and 3 are formed to be laminated through heat dissipating means 4 and the plurality of bump electrodes 15a of the semiconductor image sensor chip 2 and the plurality of bump electrodes 15b on the image signal processing chip 3 are electrically connected.

19 Claims, 7 Drawing Sheets

SEMICONDUCTOR IMAGE SENSOR MODULE, METHOD FOR MANUFACTURING THE SAME AS WELL AS CAMERA AND METHOD FOR MANUFACTURING THE SAME

CROSS REFERENCE TO RELATED APPLICATIONS

The present application is a Continuation of U.S. application Ser. No. 12/627,970, filed Nov. 30, 2009, which is a Continuation of U.S. application Ser. No. 11/810,438, filed Jun. 5, 2007, now U.S. Pat. No. 7,626,155, which is a Divisional of U.S. application Ser. No. 11/253,255, filed Oct. 18, 2005, now U.S. Pat. No. 7,319,217, which claims priority to Japanese Patent Application JP 2004-311062 filed in Japanese Patent Office on Oct. 26, 2004, the entire contents of which being incorporated herein by reference.

BACKGROUND OF THE INVENTION

1. Field of the Invention

The present invention relates to a semiconductor sensor module in which a semiconductor image sensor chip and video signal processing chip are mounted and a method for manufacturing the semiconductor sensor module as well as a camera and a method for manufacturing the camera.

2. Description of the Related Art

In an imaging device such as a digital still camera or digital video camera, a semiconductor image sensor chip such as a CCD image sensor and CMOS image sensor is used. A plurality of components such as image signal processing chips for processing image signals output from an image pickup element of the imaging device and image pickup lens are mounted on a wiring substrate.

As a related art, a technology for forming a heat sink between an image pickup element and signal processing chip is shown in FIG. 1 (refer to Patent document 1).

A chip-mounted structure shown in FIG. 1 includes a CCD image sensor 110 that is a semiconductor image sensor chip, thin plate-like heat sink 112 as heat dissipating means and a signal processing chip 116 that is a semiconductor integrated circuit IC for processing image signals from the CCD image sensor. Further, in the above-described chip-mounted structure, the heat sink 112 formed of material such as aluminum having high heat conductivity is positioned between the CCD image sensor 110 and image signal processing chip 116.

Furthermore, there has been disclosed a vision chip in which by means of a flip-chip bonding method a light-receiving unit 3 that is a semiconductor image sensor chip and an A/D converter alley 7 are connected by a flip-chip bonding bump electrode to form a module (refer to Patent document 2).

[Patent document 1] Published Japanese Patent Application No 2003-33254

[Patent document 2] Published Japanese Patent Application No 2003-23573

SUMMARY OF THE INVENTION

With the chip-mounted structure of the Patent document 1, since the CCD image sensor 110 of the semiconductor image sensor chip and signal processing chip 116 that is an IC for processing image signals are electrically connected, in which the semiconductor image sensor chip is connected to the image signal processing IC through a contact terminal 111 of the CCD image sensor such as a lead frame, resistance and capacity of the contact terminal need to be considered, which results in interfering with a high-speed image processing. Further, being contained respectively in packages, the semiconductor image sensor chip and image signal processing IC become large in size as the semiconductor sensor module. Then, art for directly connecting semiconductor chips by using a bump electrode by means of SIP (System in Package) is attracting attention.

However, it has been difficult to combine the semiconductor image sensor chip and image signal processing chip, in which a light-receiving surface and an electrode pad are provided on the same surface, by using the above-described SIP technology and flip chip bonding method without modification. In addition, since the image signal processing chip dissipates heat which is transmitted to the semiconductor image sensor chip to cause a dark current and white noise, it has been difficult to mount the both chips close to each other in a mixed state. Further, not being packaged, the image signal processing chip needs to be shielded from light, however, since the electrode pad taken out of the wiring layer of the front-illuminated type semiconductor image sensor and receiving surface are formed on the same surface, when the semiconductor image sensor and image signal processing chip are laminated to be connected to each other, it has been difficult to shield the image signal processing chip from light.

In view of the above-described points, the present invention provides a semiconductor image sensor module and a method for manufacturing the semiconductor image sensor module as well as a camera and a method for manufacturing the camera, in which a semiconductor image sensor chip and an image signal processing chip are connected with a minimum of parasitic resistance and capacity and efficient heat dissipation as well as light shielding are simultaneously obtained.

A semiconductor image sensor according to an embodiment of the present invention at least includes: a semiconductor image sensor chip that has a transistor forming region formed on a first main surface of a semiconductor substrate and that has a photoelectric conversion region with a light incident surface formed on a second main surface on the side opposite to the first main surface side and an image signal processing chip in which image signals formed in the semiconductor image sensor chip are processed, wherein a plurality of bump electrodes are formed on the first main surface of the semiconductor image sensor chip, a plurality of bump electrodes are formed on the image signal processing chip, the semiconductor image sensor chip and image signal processing chip are formed by being laminated through heat dissipating means and the plurality of bump electrodes of the semiconductor image sensor chip and the plurality of bump electrodes on the image signal processing chip are electrically connected.

According to the above embodiment of the semiconductor image sensor module of the present invention, high-speed signal processing with a minimum-sized module can be performed with the above structure, heat generated by the image signal processing chip can be dissipated through the heat dissipating means and heat conduction to the semiconductor image sensor chip can be reduced.

It is preferable that the heat dissipating means is formed of a conductive material and has openings, where a conductive electrode is formed to be surrounded with insulating materials, formed at positions corresponding to the plurality of bump electrodes therein; and the plurality of bump electrodes of the semiconductor image sensor chip and the plurality of bump electrodes on the image signal processing chip are electrically connected.

With the above-described structure, high-speed signal processing with a minimum-sized module can be performed, heat generated by the image signal processing chip can be dissipated through the heat dissipating means and heat conduction to the semiconductor image sensor chip can be reduced.

It is preferable that the above-described heat dissipating means is formed of a conductive material and has openings, where a conductive electrode formed, formed at positions corresponding to the plurality of bump electrodes of the heat dissipating means; and the plurality of bump electrodes of the semiconductor image sensor chip and the plurality of bump electrodes on the image signal processing chip are electrically connected through the conductive electrode.

With the above-described structure, high-speed signal processing with a minimum-sized module can be performed, heat generated by the image signal processing chip can be dissipated through the heat dissipating means and heat conduction to the semiconductor image sensor chip can be reduced.

In addition, it is preferable that the heat dissipating means is formed of two-layered structure of insulating material and conductive material, the openings, where the conductive electrode is formed, are formed at positions corresponding to the plurality of bump electrodes, and the insulation material side of the heat dissipating means is in contact with the semiconductor image signal processing chip and the conduction material side is in contact with the image signal processing chip; and the plurality of bump electrodes of the semiconductor sensor chip and the plurality of bump electrodes on the image signal processing chip are electrically connected through the conductive electrode.

With the above-described structure, high-speed signal processing with a minimum-sized module can be performed with the above structure, heat generated by the image signal processing chip can be dissipated through the heat dissipating means and heat conduction to the semiconductor image sensor chip can be reduced.

It is preferable that the plurality of bump electrodes of the semiconductor sensor chip and plurality of bump electrodes on the image signal processing chip are electrically connected by a connection intermediate member provided with bump electrodes formed on both surfaces and the heat dissipating means is formed to be surrounded by the connection intermediate member.

With the above-described structure, since both the chips can be connected to each other through the conductive electrodes of the connection intermediate member and heat generated by the image signal processing chip can be dissipated by using the heat dissipating means, heat conduction to the semiconductor image sensor chip can be reduced.

It is preferable that the heat dissipating means also serves as a light shielding plate with respect to the image signal processing chip.

With the above-described structure, since the semiconductor image sensor chip and image signal processing chip are disposed on both sides of the heat dissipating means in between, even when the semiconductor image sensor chip is receiving light, the image processing chip itself can be shielded from the light.

According to the embodiment of the semiconductor image sensor module of the present invention, since high-speed signal processing with a minimum-sized module can be performed with the above structure and heat generated by the image signal processing chip can be dissipated through the heat dissipating means, a dark current and white noise to the semiconductor image sensor chip can be prevented from occurring. Since the semiconductor image sensor chip and image signal processing chip are directly connected through the bump electrode, parasitic resistance and parasitic capacity can be minimized when connecting both the chips. Further, the image signal processing chip is disposed with the light receiving side of the semiconductor image sensor chip of the back-illuminated type and heat dissipating means in between, light can be shielded.

A method for manufacturing a semiconductor image sensor module according to an embodiment of the present invention includes the steps of: forming a plurality of bump electrodes on a first main surface of a semiconductor image sensor chip in which a transistor forming region is formed on a first main surface of a semiconductor substrate and a photoelectric conversion region having a light incident surface is formed on a second main surface on the opposite side to the first main surface, forming a plurality of bump electrodes on an image signal processing chip for signal-processing image signals formed in the semiconductor image sensor chip, forming the semiconductor image sensor chip and the image signal processing chip laminated through heat dissipating means and connecting the plurality of the semiconductor image sensor chip to the plurality of bump electrodes on the image signal processing chip.

A camera according to an embodiment of the present invention includes: a semiconductor image sensor module at least having a semiconductor image sensor chip that has a transistor forming region formed on a first main surface of a semiconductor substrate and that has a photoelectric conversion region with a light incident surface formed on a second main surface on the side opposite to the first main surface side and an image signal processing chip for processing image signals formed in the semiconductor image sensor chip, in which a plurality of bump electrodes are formed on the first main surface of the semiconductor image sensor chip and a plurality of bump electrodes are formed on the image signal processing chip, the semiconductor image sensor chip and image signal processing chip are formed by being laminated through heat dissipating means and the plurality of bump electrodes of the semiconductor image sensor chip and the plurality of bump electrodes on the image signal processing chip are electrically connected; and a lens provided on the second main surface side of the semiconductor image sensor module.

A method for manufacturing a camera according to an embodiment of the present invention, including the steps of: forming a plurality of bump electrodes on a first main surface of a semiconductor image sensor chip in which a transistor forming region is formed on a first main surface of a semiconductor substrate and a photoelectric conversion region with a light incident surface is formed on a second main surface on the side opposite to the first main surface, forming a plurality of bump electrodes on an image signal processing chip for processing image signals formed in the semiconductor image sensor chip, forming the semiconductor image sensor chip and the image signal processing chip laminated through heat dissipating means, connecting the plurality of the semiconductor image sensor chip to the plurality of bump electrodes on the image signal processing chip and forming a lens on the second main surface side of the semiconductor image sensor module.

BRIEF DESCRIPTION OF THE DRAWING

FIGS. 3A through 3C are diagrams showing a semiconductor image sensor module of the back-illuminated type according to an embodiment of the present invention, in which FIG. 3A is an exploded perspective view, FIG. 3B is a perspective view of FIG. 3A after assembly and FIG. 3C is a side view of FIG. 3B;

FIGS. 8A through 8C are diagrams showing a semiconductor image sensor module of the back-illuminated type according to another embodiment of the present invention, in which FIG. 8A is an exploded perspective view, FIG. 8B is a perspective view of FIG. 8A after assembly and FIG. 8C is a side view of FIG. 8B.

DESCRIPTION OF THE PREFERRED EMBODIMENTS

Hereinafter, embodiments of the present invention will be explained with reference to drawings.

Figure 1:
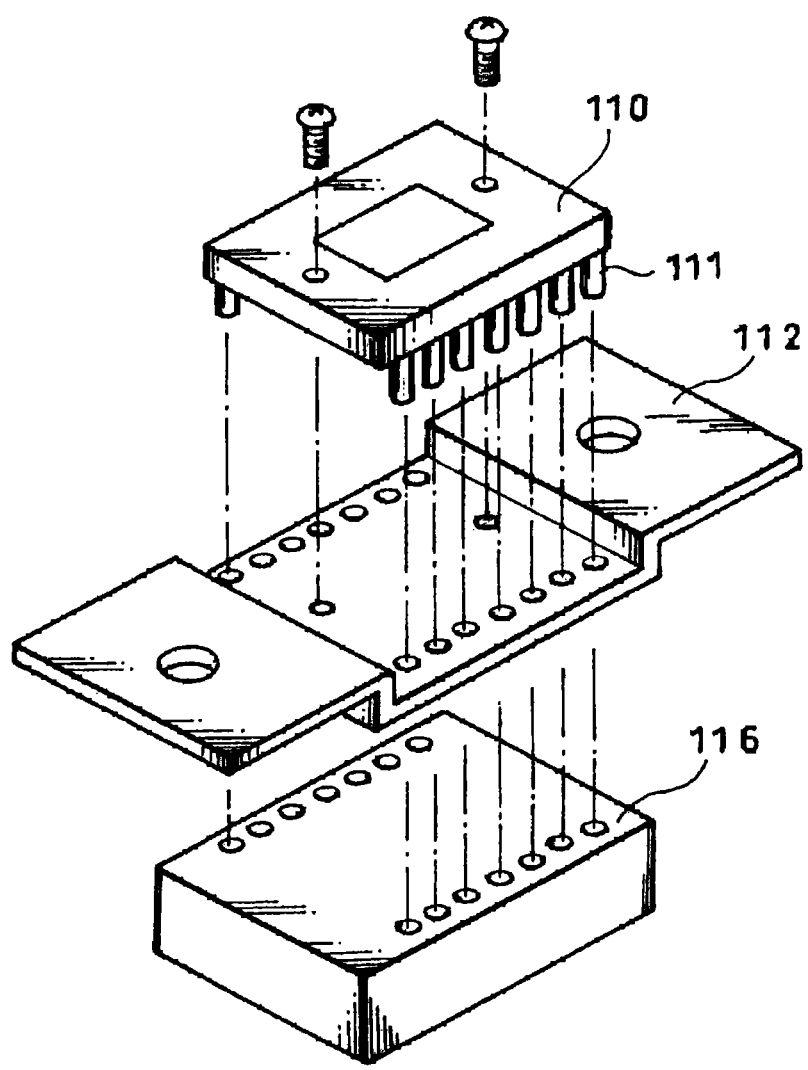
FIG. 1 shows a schematic construction of a mounted structure according to related art.
Figure 2:
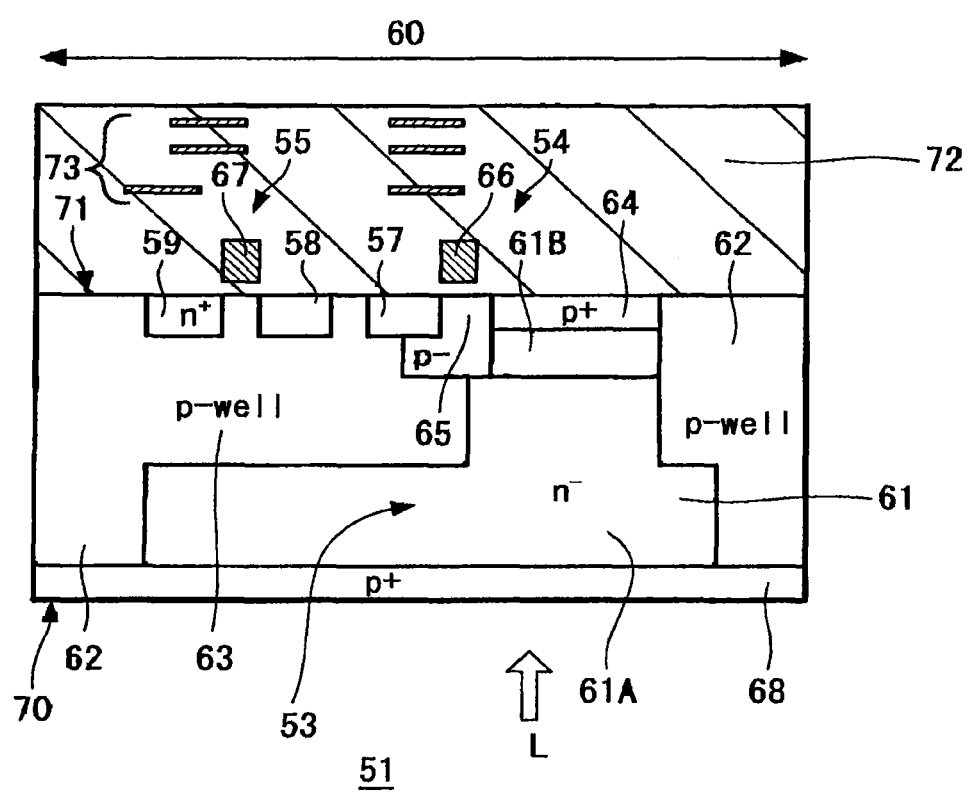
FIG. 2 is a schematic constitutional diagram showing an example of a semiconductor image sensor of a back-illuminated type.

First, a semiconductor image sensor of a back-illuminated type used for the semiconductor image sensor module according to the present invention will be explained. FIG. 2 is a schematic constitutional diagram showing an embodiment of the semiconductor image sensor of a back-illuminated type to be used for the semiconductor image sensor module according to the present invention, and specifically shows a relevant part in the vicinity of a light-receiving portion that is a photo-sensor.

As shown in FIG. 2, a back-illuminated type CMOS solid-state imaging device (what is called a semiconductor image sensor) 51 includes: a photo diode 53 to be the light-receiving portion formed in, for example, an n-type silicon substrate 61, a transfer transistor 54 formed on the substrate front surface side of a p-type well region 63 that is contiguous with a p-type pixel separation region 62 and a plurality of MOS transistors such as other transistors (reset transistor, address transistor, amplifying transistor) 55 and the like, and further, a multi-layered wiring layer 73 formed on the plurality of MOS transistors through an interlayer insulation film 72. The photo-diode 53 is formed of an n-type semiconductor region (substrate) 61, an n-type charge accumulating region 61B of high-impurity density, p+ semiconductor regions 64, 68 that become accumulation layers. Beneath the gate of the transfer transistor is formed a channel region 65. Furthermore, although not shown in the figure, a color filter, on-chip lens and the like are formed on the rear surface side of the substrate. The back-illuminated type semiconductor image sensor 51 has a large light-receiving area, because light L is received from the rear surface 70 where no wiring layer 73 is provided. In addition, since the wiring layer 73 is disposed on the typical front surface side, vignetting of light caused when receiving light from the typical front surface side can be prevented from occurring and further, bump electrodes (not shown) where receiving signals are obtained are disposed on the same surface as the wiring layer 73. Here, respective n+ regions 57, 58, 59 become source-drain regions and respective electrodes 66, 67 become gate regions of respective MOS transistors 54, 55.

Next, an embodiment of the semiconductor image sensor module of the present invention using the above-described back-illuminated type semiconductor image sensor will be explained.

Figure 3A:
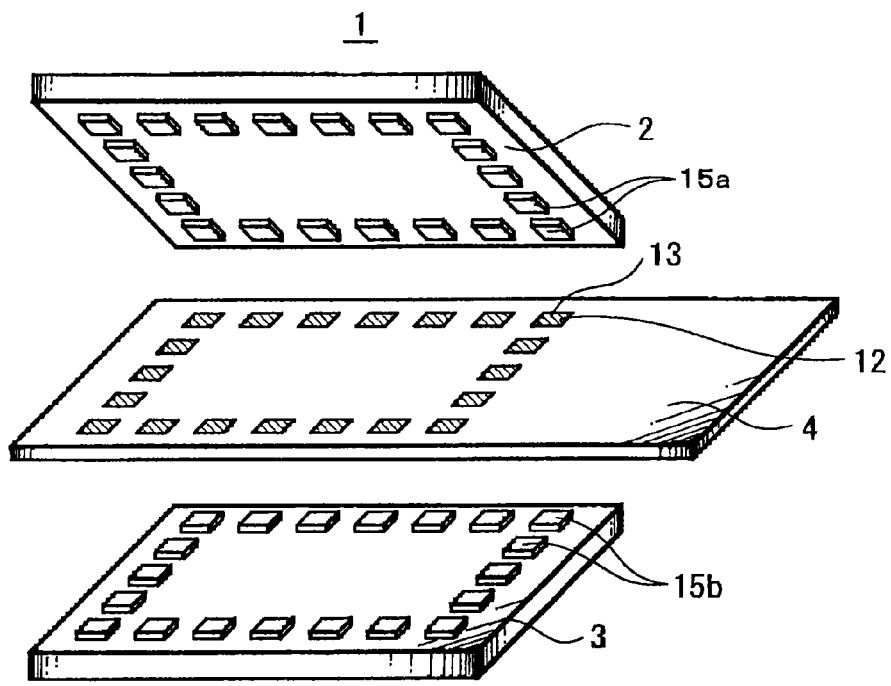
Figure 3B:
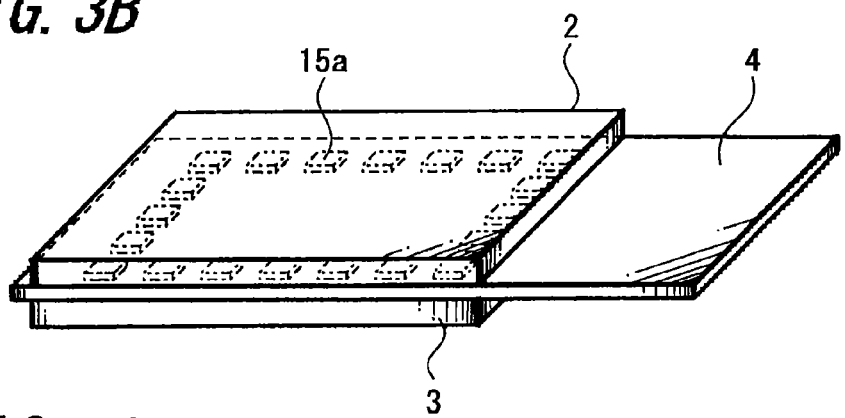
Figure 3C:
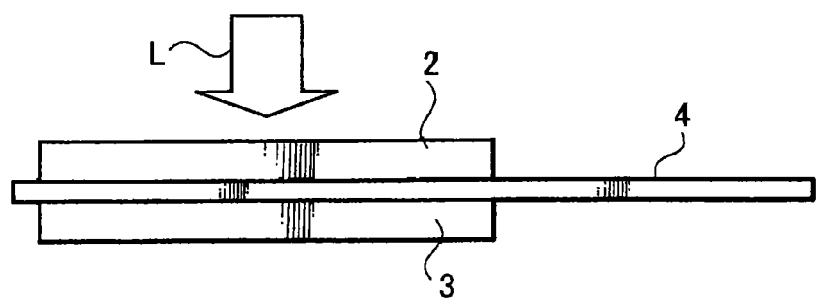

FIGS. 3A to 3C are schematic constitutional diagrams showing an embodiment of the back-illuminated type semiconductor image sensor module of the present invention. FIG. 3A is an exploded perspective view, FIG. 3B is a perspective view after assembly and FIG. 3C is a side view after assembly.

The back-illuminated type semiconductor image sensor module 1 of the present invention includes: a semiconductor image sensor chip 2 provided with a back-illuminated type semiconductor image sensor having a back-illuminated type semiconductor image sensor 51 with a plurality of bump electrodes 15a disposed on the above-described wiring layer side and an image signal processing chip 3 provided with image signal processing means for processing image signals from the semiconductor image sensor chip 2 and with a plurality of bump electrodes 15b disposed on the surface thereof, in which the semiconductor image sensor chip 2 and image signal processing chip 3 are laminated with a heat sink 4 positioned in between. The heat sink 4 has through-holes 12 at positions corresponding to the both bump electrodes 15a, 15b formed with conductive electrodes 13 formed in the through-holes 12 and the bump electrodes 15a, 15b of both the chips 2 and 3 are electrically connected through the conductive electrodes 13 of the heat sink 4. Further, surfaces where the laminated semiconductor image sensor chip 2, heat sink 4 and image signal processing chip 3 are bonded, that is, those bonded surfaces other than the bump electrodes 15a, 15b are mechanically connected with adhesive 16 (refer to FIG. 4).

Since the back-illuminated type semiconductor image sensor module 1 according to an embodiment of the present invention has a structure in which the semiconductor image sensor chip 2 and image signal processing chip 3 are electrically connected through the heat sink 4, heat generated from the image signal processing chip 3 can be dissipated and therefore reduced by the heat sink 4, and heat conduction to the semiconductor image sensor chip 2 can be prevented. As a result, dark current and white noise of the semiconductor image sensor module can be reduced. Since the heat sink 4 is positioned between the semiconductor image sensor chip 2 and image signal processing chip 3, even when the semiconductor image sensor chip 2 is receiving light, the heat sink 4 can shield the image processing chip 3 from light.

Figure 4:
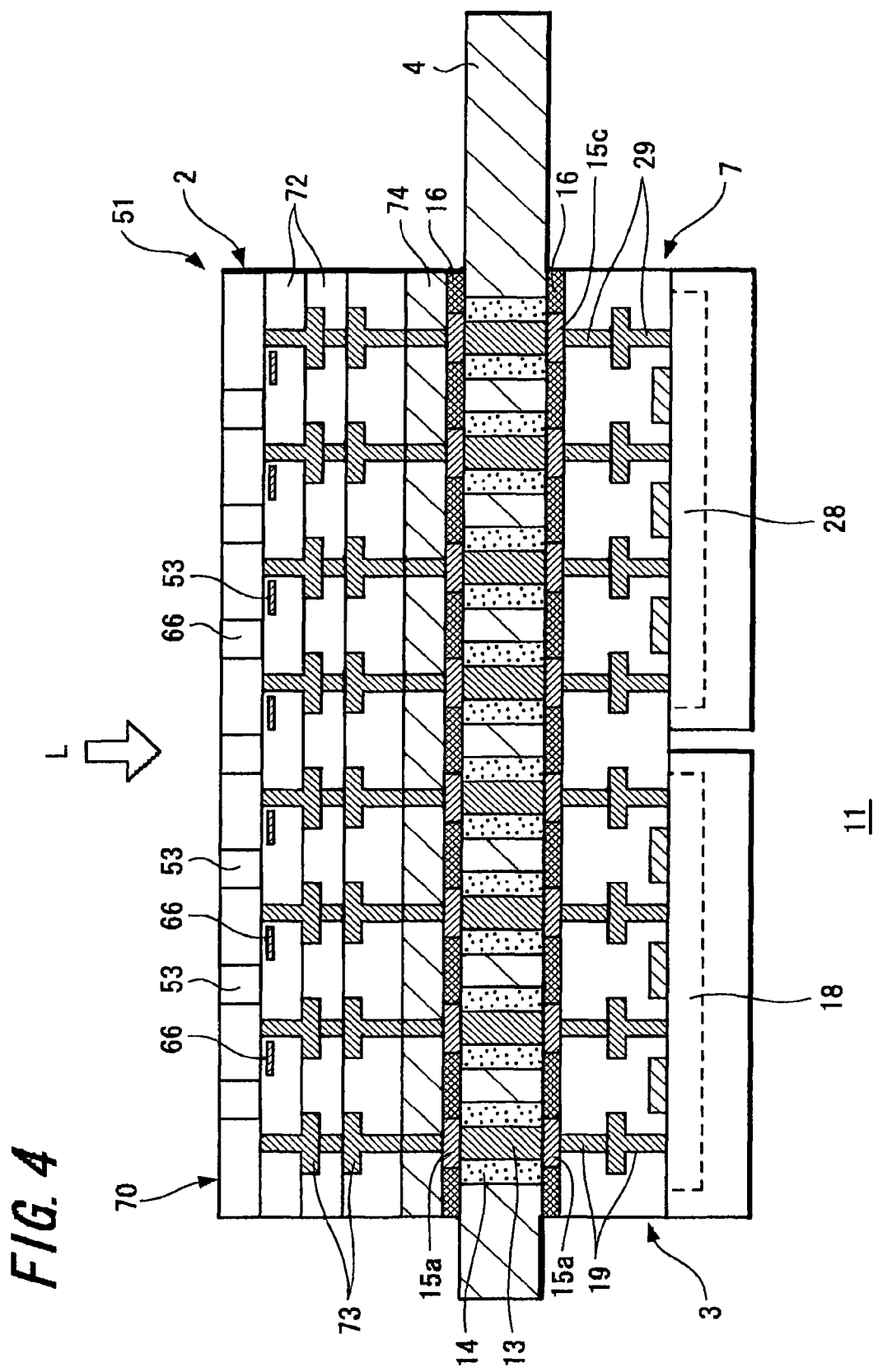
FIG. 4 is a schematic constitutional view showing the semiconductor image sensor module of the back-illuminated type according to another embodiment of the present invention.

FIG. 4 is a cross-sectional view showing the semiconductor image sensor module according to another embodiment of the present invention. That is, FIG. 4 is a schematic cross-sectional view of a relevant part in which a memory chip is mounted together with the chips 2, 3 and heat sink 4 of FIG. 3. A semiconductor image sensor module 11 according to this embodiment includes: the back-illuminated type semiconductor image sensor chip 2 is disposed on one surface of the heat sink 4 through the bump electrodes 15a and further, the image signal processing chip 3 and memory chip 7 are disposed on the other surface of the heat sink 4 through respective bump electrodes 15b and 15c. The bump electrodes 15a, 15b and 15c of respective chips 2, 3 and 7 are electrically connected to the conductive electrodes 13 formed in the through-holes 12 of the heat sink 4 and further are strongly bonded mechanically with adhesive 16.

The image signal processing chip 3 has a signal processing portion 18, and wiring layer 19 and bump electrodes 15b connecting thereto. The signal processing portion 18 performs operational processing of signals output from the semiconductor image sensor chip 2. The memory chip 7 has a memory portion 28, and wiring layer 29 and bump electrodes 15c connecting thereto. For example, nonvolatile memory, DRAM and the like are used as the memory chip 7. The memory chip is typically used, for example, for compression/decompression of image signals and the sequence thereof is; from image sensor→image signal processing chip→memory→image signal processing chip to be output. Further, when decompression is performed, in the case of vector detection (detection of movement) of animated images, an image processing sequence is; from image sensor→image signal processing chip→memory→image signal processing chip to decide information to be skipped (only animated information is made to be signals, and regarding background information, images output earlier are used). Further, there is a case of the memory being used for noise correction in which noise is stored to be interpolated and cancelled. The sequence thereof is; from image sensor→image signal processing chip→memory→image signal processing chip (interpolation/cancellation of image signals in the image sensor) to be output.

The semiconductor image sensor chip 2 can be made of: a back-illuminated type semiconductor image sensor 51 including a plurality of pixels formed into a matrix, each of which is made of a photo-diode 53 and a plurality of MOS transistors on the semiconductor substrate shown in FIG. 2 and multi-layered wiring layers 73 formed on the front surface side of the substrate through an interlayer insulation film 72, and a reinforcing support substrate 74 such as a silicon substrate and the like, for example, jointed to the wiring layers 73. In this case, the bump electrodes 15a are connected to a conductive layer penetrating the support substrate 74 and are formed on the support substrate 74.

In the back-illuminated type semiconductor image sensor 51, a photo-diode 53 receives light entered from the rear surface 70 side and electric charges to which photoelectric-conversion is performed are output as signals to the bump electrodes 15a through the wiring layers 73 on the front surface. Signals output from the semiconductor image sensor chip 2 are input as a signal into the image signal processing chip 3 through the conductive electrodes 13 formed in the heat sink 4 connected to the bump electrodes 15a.

Further, in the memory chip 7, signals are input and output through the bump electrodes 15c of the memory chip 7 and conductive electrodes 13.

Since the semiconductor image sensor module 11 according to this embodiment has a structure in which the semiconductor image sensor chip 2, the image signal processing chip 3, and memory chip 7 are electrically connected through the heat sink 4, heat generated from the image signal processing chip 3 can be dissipated and reduced by the heat sink 4 and heat conduction to the semiconductor image sensor chip 2 can be prevented. As a result, dark current and white noise of the semiconductor image sensor module can be reduced. Since the heat sink 4 is positioned between the semiconductor image sensor chip 2 and image signal processing chip 3, even when the semiconductor image sensor chip 2 is receiving light, the image processing chip 3 and memory chip 7 can be shielded from light.

Figure 5:
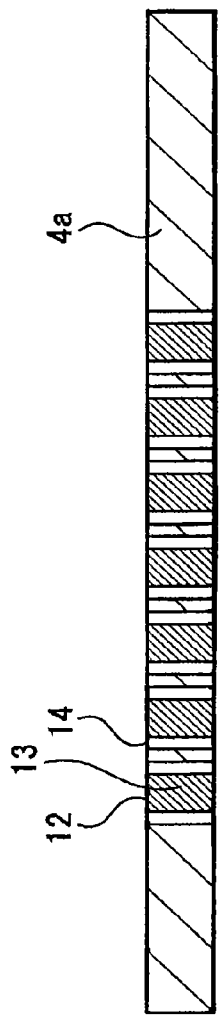
FIG. 5 is a cross-sectional view showing an example of a heat sink (first)
Figure 6:
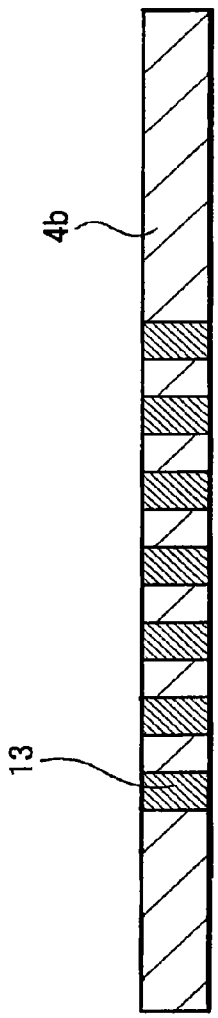
FIG. 6 is a cross-sectional view showing an example of the heat sink (second)
Figure 7:
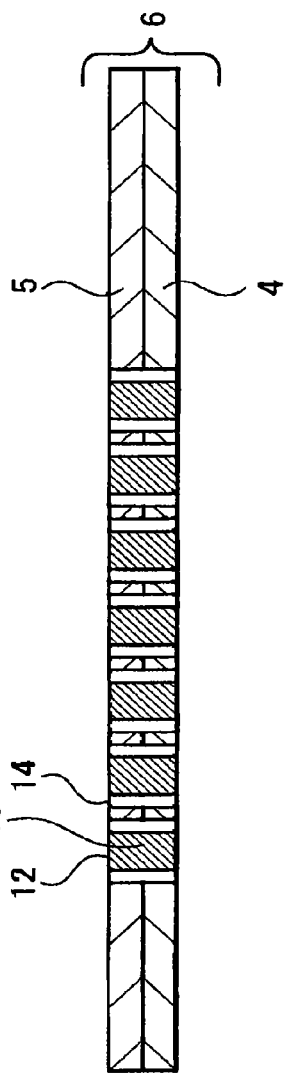
FIG. 7 is a cross-sectional view showing an example of the heat sink (third)

FIGS. 5 to 7 are cross-sectional views showing respective examples of the heat dissipating means explained above.

The heat sink 4 shown in FIG. 5, which is the heat dissipating means, is an example using a metal conductive material 4a such as an aluminum plate and copper plate as materials. In this case, through-holes 12 are formed in a conductive material 4a and conductive electrodes 13 surrounded with insulative material 14 such as glass or the like are formed in the through-holes 12.

The heat sink 4 shown in FIG. 6, which is the heat dissipating means, is an example that uses as materials an insulative material 4b such as, for example, ceramic substrate or the like. In this case, the through-holes 12 are formed in the insulative material 4b and conductive electrodes 13 are formed in the through-holes.

Further, the heat sink 4 shown in FIG. 7, which is the heat dissipating means, is made of laminated plate 6 in which the heat sink 4 and heat-insulation-plate plate 5. In the laminated plate 6, the heat sink 4 is made to be in contact with the image signal processing chip 3 side, and the heat-insulation-plate plate 5 side is disposed to be in contact with the semiconductor image sensor chip 2 side. Regarding the material of the laminated plate 6, as material for the heat sink 4, insulative materials such as ceramic and the like, for example, are used, and in the case of the insulative materials, the conductive electrodes 13 are formed in the through-holes 12. As material for the heat sink 4, when conductive materials such as, for example, Al and copper are used, through-holes 12 are formed, and inner-walls of the through-holes 12 are surrounded with insulative materials such as glass and the like to thereby form the conductive electrodes in the through-holes 12. As materials for the heat-insulation-plate plate 5, resin or the like can be used, for example.

When the laminated plate 6 is used, heat transmitting to the semiconductor image sensor chip 2 can be prevented by the heat-insulation-plate plate 5 while heat generated from the image signal processing sensor chip 3 is dissipated most efficiently by the heat insulation plate 4.

Figure 8A:
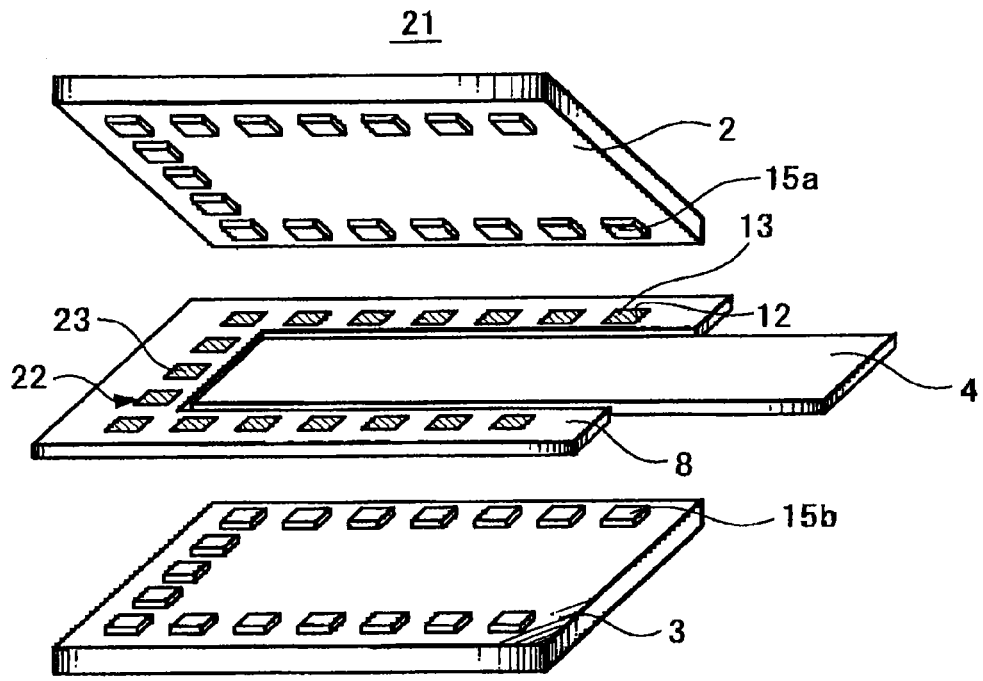
Figure 8B:
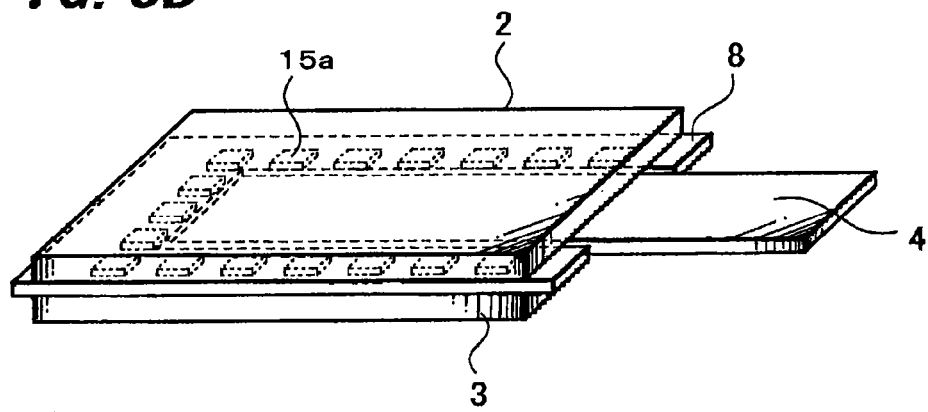
Figure 8C:
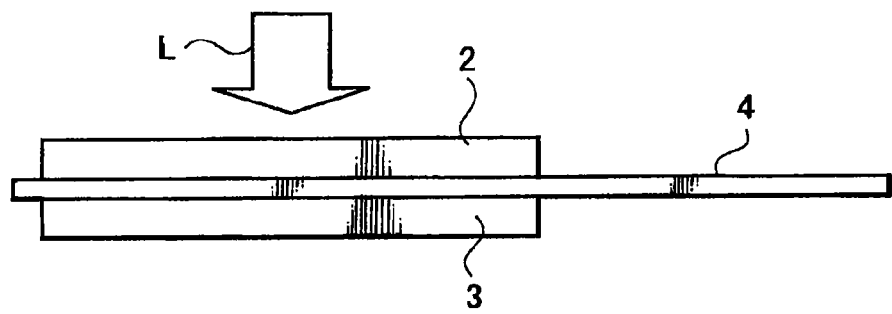

FIGS. 8A to 8C are schematic constitutional diagram showing another embodiment of the semiconductor image sensor module according to the present invention. FIG. 8A is an exploded perspective view, FIG. 8B is a perspective view after assembly, and FIG. 8C is a side view after assembly.

A semiconductor image sensor module 21 according to this embodiment includes: the semiconductor image sensor chip 2, image signal processing chip 3, and between the chips the heat sink 4 and connection intermediate member 8 surrounding the heat sink 4 provided for electrically connecting both the chips 2 and 3. Specifically, the heat sink 4 has no electrical contact with the respective bump electrodes 15a, 15b of the semiconductor image sensor chip 2 and image signal processing chip 3, and the respective bump electrodes 15a, 15b are electrically connected with the conductive electrodes 23 of the connection intermediate member 8. The connection intermediate member 8 is formed in U shape and has the function of electrically connecting the bump electrodes 15a of the semiconductor image sensor chip 2 of the back-illuminated type to the bump electrodes 15b of the image signal processing chip 3. The heat sink 4 is inserted into the U-shaped connection intermediate member 8 and the heat sink 4 is bonded to electrically insulate the semiconductor image sensor chip 2 from the image signal processing chip 3.

In order to electrically connect the bump electrodes 15a, 15b of both the chips 2, 3, the U-shaped connection intermediate member 8 can be made such that through-holes 22 are formed in the insulation plate and the conductive electrodes 23 are formed in the through-holes 22. Other than that, what is called silicon interposer, for example, can be used for the connection intermediate member 8.

For the heat sink 4, for example, aluminum and copper explained earlier or ceramic that is an insulative material or the like can be used. In addition the laminated plate 6 may be used in which the above-described heat sink and heat insulating plate are laminated. The heat sink 4 can dissipate heat particularly generated from the image signal processing chip 3. This embodiment shows an example in which the through-holes may not be used for the heat sink 4.

Figure 9:
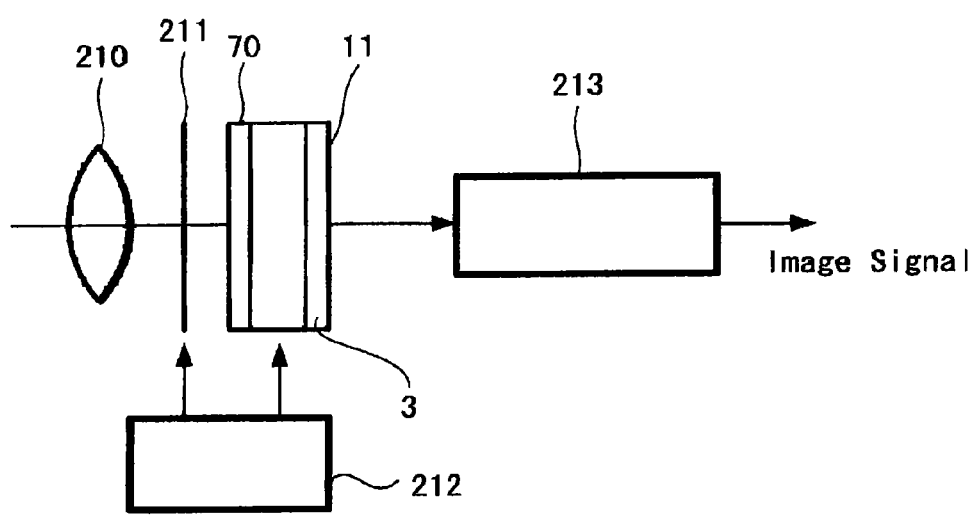
FIG. 9 is schematic constitutional view of a camera according to an embodiment of the present invention.

FIG. 9 shows a schematic constitutional view of a camera according to an embodiment of the present invention. The camera according to this embodiment is a video camera capable of picking up moving images.

The camera according to this embodiment includes: a semiconductor image sensor module 11, optical system 210, shutter device 211, drive circuit 212 and signal processing circuit 213.

On receiving image light from the subject, the optical system 210 focuses an image on the imaging surface of the semiconductor image sensor module 11. With this, relevant signal charges are accumulated in the semiconductor image sensor module 11 for a certain period of time.

The shutter device 211 controls periods of irradiation and shielding of light on the semiconductor image sensor module 11.

The drive circuit 212 supplies drive signals for controlling transferring operation of the semiconductor image sensor module and shutter operation of the shutter device 211. Electric charge transfer of the semiconductor image sensor module 11 is carried out with drive signals (timing signal) supplied from the drive circuit 212. The signal processing circuit 213 carries out various kinds of signal processing. Image signals, to which the signal processing is performed, are stored in a storage medium such as memory or are output to a monitor.

As another embodiment of the present invention, for example, there is such a semiconductor image sensor module that includes an analog/digital conversion circuit (ADC) loaded on the semiconductor image sensor chip 2, and the image signal processing chip 3 and memory chip 7 that are disposed through the heat sink 4 and electrically connected.

According to the semiconductor image sensor module of the embodiments of the present invention, since heat generated from the image signal processing chip can be reduced by the heat sink, the occurrences of the dark current and white noise to the semiconductor image sensor chip can be restrained. In addition, since the semiconductor sensor chip and image signal processing chip are laminated with the heat sink positioned in between, a layout area can be made smaller than the case of being disposed in a plane, which enables the semiconductor image sensor module to be loaded on devices such as mobile phone units requiring miniaturization. Further, since the chips are electrically connected through the bump electrodes, high-speed signal processing can be performed in the image signal processing chip and high qualities are obtained as a module. Since the semiconductor image sensor chip and image signal processing chip are directly connected through the bump electrodes, both the chips can be connected with a minimum parasitic resistance and parasitic capacity. In a packaged CCD image sensor and heat sink according to related art, the whole of the package is subjected to heat and the heat is made to escape through the heat sink, on the contrary, in the present invention, heat locally occurred in the image signal processing chip or the like which performs high-speed processing can be dissipated efficiently through the heat sink. Further, in the structure where a typical SIP technology is used and the semiconductor image sensor chip is connected to the image signal processing chip without the heat sink, the partly highly-heated image signal processing chip has unfavorably influence on the semiconductor image sensor chip directly and partly laminated. However, according to the above-described constitution of the present invention, such unfavorable influence can be restrained. Hence, high-speed processing can be performed with respect to each pixel or each column (with each signal line), or parallel processing by parallel output of a plurality of pixels such as four pixels and the like. Further, as described in the related art, high-speed processing by reducing parasitic capacity and parasitic resistance with respect to wire bonding can be made.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor device comprising at least:
a first substrate that includes an imaging unit and a plurality of first electrodes on at least one or more surfaces;
a second substrate that includes an image processing unit and a plurality of second electrodes on at least one or more surfaces; and
a heat dissipating unit formed between the first electrodes and the second electrodes,
wherein an electrical connection between the first electrodes and the second electrodes is formed when the first substrate is stacked on the second substrate, and
wherein at least one of the first electrodes and the second electrodes are surrounded with insulative material, and
wherein the heat dissipating unit is formed of conductive material, the heat dissipating unit has openings, in which the first or the second electrodes surrounded with insulative material are formed, formed at positions corresponding to each of the plurality of the first electrodes and the second electrodes and the plurality of the first electrodes of the first substrate and the plurality of the second electrodes on the second substrate are electrically connected.

2. A semiconductor device comprising at least:
a first substrate that includes an imaging unit and a plurality of first electrodes on at least one or more surfaces;
a second substrate that includes an image processing unit and a plurality of second electrodes on at least one or more surfaces; and
a heat dissipating unit formed between the first electrodes and the second electrodes,
wherein an electrical connection between the first electrodes and the second electrodes is formed when the first substrate is stacked on the second substrate, and
wherein at least one of the first electrodes and the second electrodes are surrounded with insulative material, and
wherein the heat dissipating unit is formed of a two-layer structure of heat insulative material and heat conductive material, the heat dissipating unit has openings, in which the first and the second electrodes are formed, formed at positions corresponding to the plurality of the first and the second electrodes and the heat insulative material side of the heat dissipating unit is in contact with the first substrate and the heat conductive material side is in contact with said image signal processing chip to electrically connect the plurality of the first electrodes of the first substrate and the plurality of the second electrodes on the second substrate through the electrodes.

3. A semiconductor device comprising:
a first substrate coupled to a second substrate, the first substrate including an image sensor and the second substrate including an image processing unit, wherein a plurality of first electrodes are formed on a first surface of the first substrate, a plurality of second electrodes are formed on a first surface of the second substrate, an intermediate layer is formed between the first substrate and the second substrate, the intermediate layer having through-holes formed at positions corresponding to each of the plurality of the first electrodes and the second electrodes, the first electrodes are electrically connected to the second electrodes by conductive electrodes formed within the through-holes, and within each of the through-holes, an insulative material is formed around each of the conductor electrodes.

4. The semiconductor device according to claim 3, wherein the first electrodes and the second electrodes are bump electrodes.

5. The semiconductor device according to claim 3, wherein the intermediate layer includes a heat dissipating unit.

6. The semiconductor device according to claim 5, wherein the heat dissipating unit includes a heat-conducting layer formed of a heat-conducting material.

7. The semiconductor device according to claim 5, wherein the intermediate layer includes a heat-insulating layer formed of a heat-insulative material.

8. The semiconductor device according to claim 5, wherein the heat dissipating unit is formed of a heat-conducting layer formed of a heat-conducting material, and the intermediate layer further includes a heat-insulating layer formed of a heat-insulative material.

9. The semiconductor device according to claim 8, wherein the heat-conducting layer is between the first surface of the first substrate and the heat-insulating layer.

10. The semiconductor device according to claim 9, wherein the heat dissipating unit is in contact with the first surface of the first substrate.

11. The semiconductor device according to claim 9, wherein the heat-insulating layer is in contact with the first surface of the second substrate.

12. The semiconductor device according to claim 3, wherein the intermediate layer includes a U-shaped structure, the through-holes being formed through the U-shaped structure.

13. The semiconductor device according to claim 12, wherein the heat dissipating unit is formed to extend within the arms of the U-shaped structure.

14. The semiconductor device according to claim 13, wherein the U-shaped structure is a silicon interposer.

15. The semiconductor device according to claim 3, wherein the image sensor is a CCD image sensor.

16. The semiconductor device according to claim 3, wherein the image sensor is a MOS image sensor.

17. The semiconductor device according to claim 3, wherein the image sensor is a back-illuminated type image sensor.

18. The semiconductor device according to claim 3, wherein a memory unit is formed on at least the first substrate.

19. The semiconductor device according to claim 3, wherein a memory unit is formed on at least the second substrate.

* * * * *